United States Patent
Lee et al.

(10) Patent No.: US 10,358,578 B2
(45) Date of Patent: Jul. 23, 2019

(54) INSULATING INK AND INSULATOR AND THIN FILM TRANSISTOR AND ELECTRONIC DEVICE

(71) Applicant: Samsung Electronics Co., Ltd., Suwon-si, Gyeonggi-do (KR)

(72) Inventors: Eun Kyung Lee, Seoul (KR); Jiyoung Jung, Seoul (KR); Youngjun Yun, Seongnam-si (KR); Jeong Il Park, Seongnam-si (KR); Ajeong Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/919,116

(22) Filed: Oct. 21, 2015

(65) Prior Publication Data

US 2016/0347969 A1    Dec. 1, 2016

(30) Foreign Application Priority Data

May 29, 2015   (KR) .................. 10-2015-0076082

(51) Int. Cl.
| | | |
|---|---|---|
| *H01L 29/08* | (2006.01) | |
| *C09D 183/06* | (2006.01) | |
| *H01L 51/05* | (2006.01) | |
| *H01L 51/00* | (2006.01) | |
| *C09D 11/101* | (2014.01) | |
| *C09D 11/102* | (2014.01) | |

(52) U.S. Cl.
CPC .......... *C09D 183/06* (2013.01); *C09D 11/101* (2013.01); *C09D 11/102* (2013.01); *H01L 51/0094* (2013.01); *H01L 51/0537* (2013.01); *H01L 51/0545* (2013.01); *H01L 51/0034* (2013.01); *H01L 51/0065* (2013.01); *H01L 2251/303* (2013.01)

(58) Field of Classification Search
CPC .................................................... C09D 183/06
USPC .......................................................... 257/40
See application file for complete search history.

(56) References Cited

U.S. PATENT DOCUMENTS

| | | | |
|---|---|---|---|
| 8,017,245 | B2 | 9/2011 | Lee et al. |
| 8,043,701 | B2 | 10/2011 | Edelmann et al. |
| 8,124,964 | B2 | 2/2012 | Takimiya et al. |
| 8,138,355 | B2 | 3/2012 | Watanabe |
| 8,153,267 | B2 | 4/2012 | Jeong et al. |
| 8,222,690 | B2 | 7/2012 | Ohtani et al. |
| 8,232,546 | B2 | 7/2012 | Takimiya et al. |

(Continued)

FOREIGN PATENT DOCUMENTS

| | | |
|---|---|---|
| CN | 1969023 A | 5/2007 |
| CN | 104140733 A | 11/2014 |

(Continued)

OTHER PUBLICATIONS

Extended European Search Report dated Jan. 9, 2017 issued in corresponding European Patent Application No. 16184792.6.

(Continued)

*Primary Examiner* — Ajay Arora
(74) *Attorney, Agent, or Firm* — Harness, Dickey & Pierce, P.L.C.

(57) ABSTRACT

An insulating ink includes a nanoparticle bonded with a substituent having a polymerizable functional group, at least one of an organosilane compound and polyorganosiloxane, and a solvent.

14 Claims, 4 Drawing Sheets

(56) References Cited

U.S. PATENT DOCUMENTS

| | | | |
|---|---|---|---|
| 8,314,460 | B2 | 11/2012 | Ohtani et al. |
| 8,492,496 | B2 | 7/2013 | Kumar et al. |
| 9,303,180 | B2 | 4/2016 | Yamada et al. |
| 9,431,619 | B2 | 8/2016 | Lee et al. |
| 2002/0098243 | A1 | 7/2002 | Edelmann et al. |
| 2004/0198882 | A1 | 10/2004 | Fujita |
| 2005/0259212 | A1 | 11/2005 | Lee et al. |
| 2006/0063002 | A1 | 3/2006 | Edelmann et al. |
| 2006/0147715 | A1 | 7/2006 | Lee et al. |
| 2007/0045700 | A1 | 3/2007 | Ohtani et al. |
| 2007/0049659 | A1 | 3/2007 | Quay |
| 2007/0085113 | A1 | 4/2007 | Wu et al. |
| 2007/0145357 | A1 | 6/2007 | Wu et al. |
| 2007/0266896 | A1 | 11/2007 | Suwa et al. |
| 2008/0166493 | A1 | 7/2008 | Xiao et al. |
| 2010/0323570 | A1* | 12/2010 | Kumar ............... B82Y 30/00 442/59 |
| 2011/0001190 | A1 | 1/2011 | Ide et al. |
| 2011/0068417 | A1 | 3/2011 | Murase et al. |
| 2011/0086946 | A1* | 4/2011 | Kotake ............ C09D 11/033 523/400 |
| 2011/0259464 | A1 | 10/2011 | Lacroix et al. |
| 2012/0132346 | A1 | 5/2012 | Chen et al. |
| 2012/0277339 | A1 | 11/2012 | Bajjuri et al. |
| 2013/0320316 | A1 | 12/2013 | Park et al. |
| 2014/0336329 | A1 | 11/2014 | Yamada et al. |
| 2014/0357827 | A1 | 12/2014 | Swier |
| 2015/0011699 | A1 | 1/2015 | Shukla et al. |
| 2015/0090979 | A1 | 4/2015 | Lee et al. |
| 2015/0168837 | A1 | 6/2015 | Loccufier et al. |
| 2015/0203707 | A1 | 7/2015 | Klun et al. |
| 2015/0203708 | A1 | 7/2015 | Klun et al. |
| 2015/0218294 | A1 | 8/2015 | Klun et al. |
| 2015/0221797 | A1 | 8/2015 | Klun et al. |
| 2015/0232386 | A1 | 8/2015 | Vyakaranam et al. |
| 2016/0013425 | A1 | 1/2016 | Takeya et al. |
| 2016/0013443 | A1 | 1/2016 | Takemura |

FOREIGN PATENT DOCUMENTS

| | | | |
|---|---|---|---|
| EP | 1760126 | A1 | 3/2007 |
| JP | 2002-265870 | A | 9/2002 |
| JP | 2006-199752 | A | 8/2006 |
| JP | 2007-122029 | A | 5/2007 |
| JP | 2007-277332 | A | 10/2007 |
| JP | 2008-298862 | A | 12/2008 |
| JP | 2009-102628 | A | 5/2009 |
| JP | 2009-267134 | A | 11/2009 |
| JP | 2010-147206 | A | 7/2010 |
| JP | 2010250733 | A * | 11/2010 |
| JP | 2011-186069 | A | 9/2011 |
| JP | 2011-187558 | A | 9/2011 |
| JP | 2011-246548 | A | 12/2011 |
| JP | 2013-234301 | A | 11/2013 |
| JP | 2013-249395 | A | 12/2013 |
| JP | 2014-37453 | A | 2/2014 |
| JP | 2014-48569 | A | 3/2014 |
| JP | 2014-82467 | A | 5/2014 |
| KR | 2005-0036171 | A | 4/2005 |
| KR | 20070024375 | A | 3/2007 |
| KR | 2008-0002542 | A | 1/2008 |
| KR | 2010-026154 | A | 2/2008 |
| KR | 10-0884357 | B1 | 2/2009 |
| KR | 20100077798 | A | 7/2010 |
| KR | 20100114046 | A | 10/2010 |
| KR | 2010-0126407 | A | 12/2010 |
| KR | 2011-0101073 | A | 9/2011 |
| KR | 2011-0106429 | A | 9/2011 |
| KR | 2014-0070476 | A | 6/2014 |
| KR | 2015-0035370 | A | 4/2015 |
| WO | WO-2008/026602 | A1 | 3/2008 |
| WO | WO-2009/009790 | A1 | 1/2009 |
| WO | WO-2009/116373 | A1 | 9/2009 |
| WO | WO-2010/044332 | A1 | 4/2010 |
| WO | WO-2013/182328 | A1 | 12/2013 |
| WO | WO-2014/025387 | A1 | 2/2014 |
| WO | WO-2014/136827 | A1 | 9/2014 |

OTHER PUBLICATIONS

U.S. Office Action dated Jun. 8, 2017 issued in co-pending U.S. Appl. No. 15/239,424.

H.-J. Gläsal, Radiation-cured polymeric nanocomposites of enhanced surface-mechanical properties, 2003, 303-308 pages, Elsevier B.V.

Jérôme Douce, Effect of filler size and surface condition of nano-sized silica particles in polysiloxane coatings, May 2004, 114-122 pages, Elsevier B.V.

Ying-Ling Liu, Poly(dimethylsiloxane) Star Polymers Having Nanosized Silica Cores, Macromol. Rapid Commun., Jun. 2004, 1392-1395 pages, Wiley-VCH Verlag GmbH & Co. KGaG, Weinheim.

Anubha Goyal, Metal salt induced synthesis of hybrid metal core-siloxane shell nanoparticles and siloxane nanowires, Chem. Commun., Jan. 2010, 964-966 pages, The Royal Society of Chemistry.

Hwa Sung Lee, Interpenetrating polymer network dielectrics for high-performance organic field-effect transistors, Journal of Materials Chemistry, Mar. 2011, 6968-6974 pages, The Royal Society of Chemistry.

Sunho Jeong, Photopatternable Organosiloxane-Based Inorganic-Organic $SiO_2$—$ZrO_2$ Hybrid Dielectrics for Organic Thin Film Transistors, The Journal of Physical Chemistry Letters, Sep. 2007, 16083-16087 pages, American Chemical Society.

Irini D. Sideridou, et al. "Effect of the Structure of Silane-Coupling Agent on Dynamic Mechanical Properties of Dental Resin—Nanocomposites," Journal of Applied Polymer Science vol. 110(1), 507-516 (2008).

Extended European Search Report dated Mar. 8, 2016 issued in corresponding European Patent Application No. 15197322.9.

U.S. Office Action dated Nov. 13, 2017 issued in co-pending U.S. Appl. No. 15/239,424.

U.S. Office Action dated Jun. 28, 2018 issued in copending U.S. Appl. No. 14/953,884.

U.S. Office Action dated Apr. 11, 2018 issued in co-pending U.S. Appl. No. 14/953,884.

Office Action dated Jan. 18, 2019 for copending U.S. Appl. No. 14/953,884.

Office Action from the Chinese Patent Office for CN 201510862159.9 dated Dec. 5, 2018, with an English language translation.

* cited by examiner

INSULATING INK AND INSULATOR AND THIN FILM TRANSISTOR AND ELECTRONIC DEVICE

CROSS REFERENCE TO RELATED APPLICATION

This application claims priority to and the benefit of Korean Patent Application No. 10-2015-0076082, filed in the Korean Intellectual Property Office, on May 29, 2015, the entire contents of which are incorporated herein by reference.

BACKGROUND

1. Field

Example embodiments provide an insulating ink, an insulator, a thin film transistor, and an electronic device.

2. Description of the Related Art

A flat panel display (e.g., a liquid crystal display (LCD), an organic light emitting diode (OLED) display, and an electrophoretic display) includes a pair of electric field-generating electrodes and an electrical optical active layer interposed therebetween. The liquid crystal display (LCD) includes a liquid crystal layer as an electrical optical active layer, and the organic light emitting diode (OLED) display includes an organic emission layer as an electrical optical active layer.

One of the pair of the electric field-generating electrodes is commonly connected to a switching device and receives an electrical signal, and the electrical optical active layer transforms the electrical signal into an optical signal and thus displays an image.

The flat panel display includes a thin film transistor panel having a thin film transistor (TFT), which is a three-terminal element as a switching device, a gate line transmitting a scan signal for controlling the thin film transistor, and a data line transmitting a signal applied to a pixel electrode.

In the thin film transistor, characteristics (e.g., carrier mobility, a leakage current, and an on/off current ratio (Ion/Ioff ratio)) may be determined by the various factors, but the performance of a gate insulator contacting a semiconductor is important among them.

SUMMARY

Example embodiments provide an insulating ink that may be applicable as a gate insulator having higher reliability.

Example embodiments also provide an insulator including a cured product of the insulating ink.

Example embodiments also provide a thin film transistor including the insulator.

Example embodiments also provide an electronic device including the thin film transistor.

According to example embodiments, an insulating ink includes a nanoparticle bonded with a substituent having a polymerizable functional group, at least one of an organosilane compound and polyorganosiloxane, and a solvent.

The nanoparticle may be represented by Chemical Formula 1.

[Chemical Formula 1]

In Chemical Formula 1,

M is a nanoparticle,

L is one of a single bond, a substituted or unsubstituted $C_1$ to $C_{20}$ alkylene group, a substituted or unsubstituted $C_6$ to $C_{30}$ arylene group, a substituted or unsubstituted $C_3$ to $C_{30}$ bivalent heterocyclic group, a substituted or unsubstituted bivalent silyl group, a substituted or unsubstituted bivalent siloxane group, and a combination thereof, A is a polymerizable functional group, and n is an integer of 1 or more.

The polymerizable functional group may include one of a (meth)acrylate group, an epoxy group, a styrene group, an acrylonitrile group, an N-vinylpyrrolidone group, a vinyl group, a derivative thereof, and a combination thereof.

The organosilane compound and the polyorganosiloxane may include at least one reactive functional group.

The at least one reactive functional group may be one of a substituted or unsubstituted $C_2$ to $C_{30}$ alkenyl group, a substituted or unsubstituted $C_1$ to $C_{30}$ epoxy group, and a combination thereof.

The organosilane compound may be represented by one of Chemical Formulae 2 to 5.

[Chemical Formula 2]

[Chemical Formula 3]

[Chemical Formula 4]

[Chemical Formula 5]

In Chemical Formulae 2 to 5, each of $R^1$ to $R^6$ are independently one of hydrogen, a substituted or unsubstituted $C_1$ to $C_{30}$ alkyl group, a substituted or unsubstituted $C_3$ to $C_{30}$ cycloalkyl group, a substituted or unsubstituted $C_6$ to $C_{30}$ aryl group, a substituted or unsubstituted C7 to $C_{30}$ arylalkyl group, a substituted or unsubstituted $C_1$ to $C_{30}$ heteroalkyl group, a substituted or unsubstituted $C_2$ to $C_{30}$ heterocycloalkyl group, a substituted or unsubstituted $C_2$ to $C_{30}$ alkenyl group, a substituted or unsubstituted $C_2$ to $C_{30}$ alkynyl group, a substituted or unsubstituted $C_1$ to $C_{30}$ alkoxy group, a substituted or unsubstituted $C_1$ to $C_{30}$ epoxy group, a substituted or unsubstituted $C_1$ to $C_{30}$ carbonyl group, a hydroxy group, and a combination thereof, and each of $Z^1$ to $Z^{10}$ are independently one of a substituted or unsubstituted $C_1$ to $C_6$ alkoxy group, a halogen, a carboxyl group, and a combination thereof.

At least one of $R^1$ to $R^6$ of Chemical Formulae 2 to 5 may include one of a substituted or unsubstituted $C_2$ to $C_{30}$ alkenyl group, a substituted or unsubstituted $C_1$ to $C_{30}$ epoxy group, and a combination thereof.

The polyorganosiloxane may include a chemical structure represented by Chemical Formula 6.

[Chemical Formula 6]

In Chemical Formula 6, each of $R^1$ to $R^6$ are independently one of hydrogen, a substituted or unsubstituted $C_1$ to $C_{30}$ alkyl group, a substituted or unsubstituted $C_3$ to $C_{30}$ cycloalkyl group, a substituted or unsubstituted $C_6$ to $C_{30}$ aryl group, a substituted or unsubstituted C7 to $C_{30}$ arylalkyl group, a substituted or unsubstituted $C_1$ to $C_{30}$ heteroalkyl group, a substituted or unsubstituted $C_2$ to $C_{30}$ heterocycloalkyl group, a substituted or unsubstituted $C_2$ to $C_{30}$ alkenyl group, a substituted or unsubstituted $C_2$ to $C_{30}$ alkynyl group, a substituted or unsubstituted $C_1$ to $C_{30}$ alkoxy group, a substituted or unsubstituted $C_1$ to $C_{30}$ epoxy group, a substituted or unsubstituted $C_1$ to $C_{30}$ carbonyl group, a hydroxy group, and a combination thereof, $0 \le M1 < 1$, $0 \le D1 < 1$, $0 \le T1 < 1$, $0 \le Q1 < 1$, and $M+D+T+Q=1$.

At least one of $R^1$ to $R^6$ of Chemical Formula 6 may include one of a substituted or unsubstituted $C_2$ to $C_{30}$ alkenyl group, a substituted or unsubstituted $C_1$ to $C_{30}$ epoxy group, and a combination thereof.

At least one of R4 to R6 of Chemical Formula 6 may include one of a substituted or unsubstituted $C_2$ to $C_{30}$ alkenyl group, a substituted or unsubstituted $C_1$ to $C_{30}$ epoxy group, and a combination thereof.

The nanoparticle may include a metal oxide.

The nanoparticle may include one of silica, titania, barium titanate, zirconia, barium sulfate, alumina, hafnium oxide, and a combination thereof.

The nanoparticle may be present in an amount of about 2 to about 70 parts by weight based on 100 parts by weight of at least one of the organosilane compound and the polyorganosiloxane.

The insulating ink may further include at least one of a cross-linking agent and a cross-linking auxiliary agent.

The cross-linking agent may be one of a (meth)acrylate compound and an ether compound, and the cross-linking auxiliary agent may be an organometal compound.

The insulating ink may further include at least one of a photoinitiator, a photoacid generator, and a dispersing agent.

According to example embodiments, an insulator includes a cured product of the insulating ink of example embodiments.

According to example embodiments, a thin film transistor includes a gate electrode, a semiconductor overlapping the gate electrode, the insulator of example embodiments between the gate electrode and the semiconductor, and a source electrode and a drain electrode electrically connected with the semiconductor.

The semiconductor may be an organic semiconductor.

According to example embodiments, an electronic device includes the thin film transistor of example embodiments.

DETAILED DESCRIPTION

The present disclosure will be described more fully hereinafter with reference to the accompanying drawings, in which example embodiments are shown. However, this disclosure may be embodied in many different forms, and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, when a definition is not otherwise provided, the term "substituted" refers to one substituted with a substituent selected from deuterium, a halogen, a hydroxy group, an amino group, a $C_1$ to $C_{30}$ amine group, a nitro group, a $C_1$ to $C_{40}$ silyl group, a $C_1$ to $C_{30}$ alkyl group, a $C_1$ to $C_{10}$ alkylsilyl group, a $C_6$ to $C_{30}$ aryl group, a $C_2$ to $C_{30}$ heterocyclic group, a $C_1$ to $C_{20}$ alkoxy group, a $C_1$ to $C_{10}$ trifluoroalkyl group (e.g., a trifluoromethyl group), or a cyano group, instead of at least one hydrogen of a substituent or a compound.

As used herein, when a definition is not otherwise provided, the term "metal" refers to a metal and a semi-metal.

Hereinafter, an insulating ink according to example embodiments is described.

The insulating ink according to example embodiments includes a nanoparticle bonded with a substituent having a polymerizable functional group, at least one of an organosilane compound and polyorganosiloxane, and a solvent.

The nanoparticle is not particularly limited as long as it has an average particle diameter ranging from several nanometers to several tens of nanometers, for example, an average particle diameter ranging from about 1 nm to about 100 nm. The nanoparticle may be, for example, a metal oxide, for example, one of silica, titania, barium titanate, zirconia, barium sulfate, alumina, hafnium oxide, and a combination thereof, but is not limited thereto. The nanoparticle may have a sphere shape but is not limited thereto, and may have the various shapes, e.g., a rod shape, a sheet shape, and a tube shape.

The nanoparticle is surface treated and bonded with at least one substituent having a polymerizable functional group. The substituent may be bonded to the surface of the nanoparticle according to the various methods. For example, the nanoparticle may have at least one reaction site, which may produce a condensation reaction, e.g., a hydroxy group, an alkoxy group, a halogen, and/or a carboxyl group on the surface thereof, and the nanoparticle may be reacted with a compound having a polymerizable functional group at the reaction site and bonded.

The polymerizable functional group may be a photopolymerizable functional group and/or a thermally polymerizable functional group. The polymerizable functional group may be, for example a functional group having an alkenyl group and/or an epoxy group. The polymerizable functional group may be, for example, one of a (meth)acrylate group, an epoxy group, a styrene group, an acrylonitrile group, an N-vinylpyrrolidone group, a vinyl group, a derivative thereof, and a combination thereof, but is not limited thereto.

The substituent having the polymerizable functional group may substantially not have a hydroxy group (—OH). When including the hydroxy group at greater than or equal to a predetermined or given amount, hysteresis occurs by driving an electronic device including the insulating ink, so that the device performance may be deteriorated.

The hydroxy group may be included at less than or equal to about 1 on average, for the substituent having the polymerizable functional group, for example an average of less than or equal to about 0.5, for example an average of less than or equal to about 0.3, or for example may not be included.

The surface-treated nanoparticle may be, for example, represented by Chemical Formula 1.

[Chemical Formula 1]

In Chemical Formula 1,

M is a nanoparticle,

L is one of a single bond, a substituted or unsubstituted $C_1$ to $C_{20}$ alkylene group, a substituted or unsubstituted $C_6$ to $C_{30}$ arylene group, a substituted or unsubstituted $C_3$ to $C_{30}$ bivalent heterocyclic group, a substituted or unsubstituted bivalent silyl group, a substituted or unsubstituted bivalent siloxane group, and a combination thereof, A is a polymerizable functional group, and n is an integer of 1 or more.

For example, M may be one of silica, titania, barium titanate, zirconia, barium sulfate, alumina, hafnium oxide, and a combination thereof.

For example, A may be a photopolymerizable functional group and/or thermally polymerizable functional group, for example, one of a (meth)acrylate group, an epoxy group, a styrene group, an acrylonitrile group, an N-vinylpyrrolidone group, a vinyl group, a derivative thereof, and a combination thereof.

For example, n may be 1 to 10.

The organosilane compound may have at least one functional group that is capable of a condensation reaction, and the functional group that is capable of a condensation reaction may be, for example, one of a substituted or unsubstituted $C_1$ to $C_6$ alkoxy group, a halogen, a carboxyl group, and a combination thereof.

The organosilane compound may have at least one reactive functional group, and the reactive functional group may be, for example, one of a substituted or unsubstituted $C_2$ to $C_{30}$ alkenyl group, a substituted or unsubstituted $C_1$ to $C_{30}$ epoxy group, and a combination thereof.

The organosilane compound may be, for example, represented by one of Chemical Formulae 2 to 5.

$R^1R^2R^3SiZ^1$             [Chemical Formula 2]

$R^4R^5SiZ^2Z^3$             [Chemical Formula 3]

$R^6SiZ^4Z^5Z^6$             [Chemical Formula 4]

$SiZ^7Z^8Z^9Z^{10}$             [Chemical Formula 5]

In Chemical Formulae 2 to 5, each of $R^1$ to $R^6$ are independently one of hydrogen, a substituted or unsubstituted $C_1$ to $C_{30}$ alkyl group, a substituted or unsubstituted $C_3$ to $C_{30}$ cycloalkyl group, a substituted or unsubstituted $C_6$ to $C_{30}$ aryl group, a substituted or unsubstituted C7 to $C_{30}$ arylalkyl group, a substituted or unsubstituted $C_1$ to $C_{30}$ heteroalkyl group, a substituted or unsubstituted $C_2$ to $C_{30}$ heterocycloalkyl group, a substituted or unsubstituted $C_2$ to $C_{30}$ alkenyl group, a substituted or unsubstituted $C_2$ to $C_{30}$ alkynyl group, a substituted or unsubstituted $C_1$ to $C_{30}$ alkoxy group, a substituted or unsubstituted $C_1$ to $C_{30}$ epoxy group, a substituted or unsubstituted $C_1$ to $C_{30}$ carbonyl group, a hydroxy group, and a combination thereof, and each of $Z^1$ to $Z^{10}$ are independently one of a substituted or unsubstituted $C_1$ to $C_6$ alkoxy group, a hydroxy group, a halogen, a carboxyl group, and a combination thereof.

For example, at least one of $R^1$ to $R^6$ of Chemical Formulae 2 to 5 may have a reactive functional group, for example, one of a substituted or unsubstituted $C_2$ to $C_{30}$ alkenyl group, a substituted or unsubstituted $C_1$ to $C_{30}$ epoxy group, and a combination thereof.

One or more of the organosilane compounds may be used.

The polyorganosiloxane may include, for example, a chemical structure represented by Chemical Formula 6.

$(R^1R^2R^3SiO_{1/2})_{M1}(R^4R^5SiO_{2/2})_{D1}(R^6SiO_{3/2})_{T1}$
$(SiO_{4/2})_{Q1}$             [Chemical Formula 6]

In Chemical Formula 6, each of $R^1$ to $R^6$ are independently one of hydrogen, a substituted or unsubstituted $C_1$ to $C_{30}$ alkyl group, a substituted or unsubstituted $C_3$ to $C_{30}$ cycloalkyl group, a substituted or unsubstituted $C_6$ to $C_{30}$ aryl group, a substituted or unsubstituted C7 to $C_{30}$ arylalkyl group, a substituted or unsubstituted $C_1$ to $C_{30}$ heteroalkyl group, a substituted or unsubstituted $C_2$ to $C_{30}$ heterocycloalkyl group, a substituted or unsubstituted $C_2$ to $C_{30}$ alkenyl group, a substituted or unsubstituted $C_2$ to $C_{30}$ alkynyl group, a substituted or unsubstituted $C_1$ to $C_{30}$ alkoxy group, a substituted or unsubstituted $C_1$ to $C_{30}$ epoxy group, a substituted or unsubstituted $C_1$ to $C_{30}$ carbonyl group, a hydroxy group, and a combination thereof, $0 \leq M1 < 1$, $0 \leq D1 < 1$, $0 \leq T1 < 1$, $0 \leq Q1 < 1$, and $M+D+T+Q=1$.

For example, at least one of $R^1$ to $R^6$ of Chemical Formula 6 may include at least one reactive functional group, for example, one of a substituted or unsubstituted $C_2$ to $C_{30}$ alkenyl group, a substituted or unsubstituted $C_1$ to $C_{30}$ epoxy group, and a combination thereof.

For example, at least one of R4 to R6 of Chemical Formula 6 may include a reactive functional group, for example, one of a substituted or unsubstituted $C_2$ to $C_{30}$ alkenyl group, a substituted or unsubstituted $C_1$ to $C_{30}$ epoxy group, and a combination thereof.

For example, at least one of R1 to R6 of Chemical Formula 6 may include a substituted or unsubstituted $C_6$ to $C_{30}$ aryl group.

For example, in Chemical Formula 6, at least one of D1 and T1 may not be zero (0), and accordingly, a polyorganosiloxane having a chain structure and/or a reticular structure may be provided.

For example, a weight average molecular weight of the polyorganosiloxane may be about 100 to about 1,000,000, for example about 100 to about 100,000, or about 100 to about 50,000.

The polyorganosiloxane may be obtained by a condensation polymerization of at least one organosilane compound. The organosilane compound may be at least one of compounds represented by Chemical Formulae 2 to 5, for example at least one of a monomer represented by Chemical Formula 2, at least one of a monomer represented by Chemical Formula 3, at least one of a monomer represented by Chemical Formula 4, and/or at least one of a monomer represented by Chemical Formula 5.

The surface-treated nanoparticle may be present in an amount of about 1 to about 80 parts by weight based on 100 parts by weight of the organosilane compound and/or the polyorganosiloxane. Within the range, the surface-treated nanoparticle may be present in an amount of about 2 to about 70 parts by weight based on 100 parts by weight of the organosilane compound and/or the polyorganosiloxane.

The insulating ink may further include a cross-linking agent. The cross-linking agent may include, for example, one of a photo-cross-linking agent, a thermal cross-linking agent, and a combination thereof. The photo-cross-linking agent may be, for example a (meth)acrylate compound, for example pentaerythritol triacrylate, but is not limited thereto. The thermal cross-linking agent may be, for example, one of an ether compound, for example trimethylpropane triglycidyl ether, 1,4-butanedioldivinylether, tri(ethylene glycol)divinylether, trimethylolpropane trivinyl ether, or 1,4-cyclohexanedimethanol divinyl ether, and a combination thereof, but is not limited thereto.

The cross-linking agent may be present in an amount of about 0.1 to about 50 parts by weight based on 100 parts by weight of the polyorganosiloxane. The cross-linking agent may be present in an amount of about 10 to about 50 parts by weight.

The insulating ink may further a cross-linking auxiliary agent. The cross-linking auxiliary agent may be, for example, a photo-cross-linking auxiliary agent and/or a thermal cross-linking auxiliary agent, and may effectively decrease or remove unreacted reactants after a cross-linking reaction. The cross-linking auxiliary agent may be, for example, a polymer and/or an organometallic compound. The cross-linking auxiliary agent may be, for example, an organometallic compound (e.g., an aluminum organic compound, a titanium organic compound, a zirconium organic compound, and/or a hafnium organic compound), for example, aluminum acetoacetate, but is not limited thereto.

The cross-linking auxiliary agent may be present in an amount of about 0.1 to about 30 parts by weight based on 100 parts by weight of the polyorganosiloxane. The cross-linking auxiliary agent may be present in an amount of about 1 to about 20 parts by weight by weight based on 100 parts by weight of the polyorganosiloxane.

The insulating ink may further include at least one of a photoinitiator, a photoacid generator, and a dispersing agent.

The solvent is not particularly limited, and may be, for example, an aliphatic hydrocarbon solvent (e.g., hexane), an aromatic hydrocarbon solvent (e.g., anisole, mesitylene, and xylene), a ketone-based solvent (e.g., methyl isobutyl ketone, 1-methyl-2-pyrrolidinone, and acetone), an ether based solvent (e.g., cyclohexanone, tetrahydrofuran, and isopropyl ether), an acetate based solvent (e.g., ethylacetate, butyl acetate, and propylene glycol methyl ether acetate), an alcohol based solvent (e.g., isopropyl alcohol and butanol), an amide based solvent (e.g., dimethyl acetamide and dimethyl formamide), a silicon-based solvent, or a combination thereof.

The solvent may be included in the balance other than the components, for example, the total amount of solid except the solvent in the insulating ink may range from about 5 to about 80 wt %, or may range from about 5 to about 50 wt % within the range.

The insulating ink may be coated on a substrate or a lower layer and cured to provide an insulator. The coating may include, for example, spin coating, slit coating, bar coating, and/or inkjet printing, and the curing may include, for example, photocuring and/or thermally curing.

The insulator, which is an organic/inorganic composite insulator, may improve insulation strength, a dielectric constant, heat resistance, and chemical resistance, compared to the organic insulator. In addition, as the insulator, which is an organic/inorganic composite insulator, may be obtained by a solution process unlike the inorganic insulator, the process may be simplified.

The insulator may have a dense and rigid film quality by a network structure of a dense cross-linking bond of a substituent having a polymerizable functional group, disposed on the surface of the nanoparticle, and an organosilane compound and/or a polyorganosiloxane. Thereby, when the insulator is used for a gate insulator of a thin film transistor, the insulator may provide the improved layer quality and the relatively high insulation strength, so as to decrease a leakage current and to improve thin film transistor characteristics.

The insulator may be used in fields requiring the insulating characteristics of electronic devices without limitation, for example, a gate insulator, a dielectric material, or a filler.

Hereinafter, a thin film transistor including the insulator as one example is described.

Figure 1:
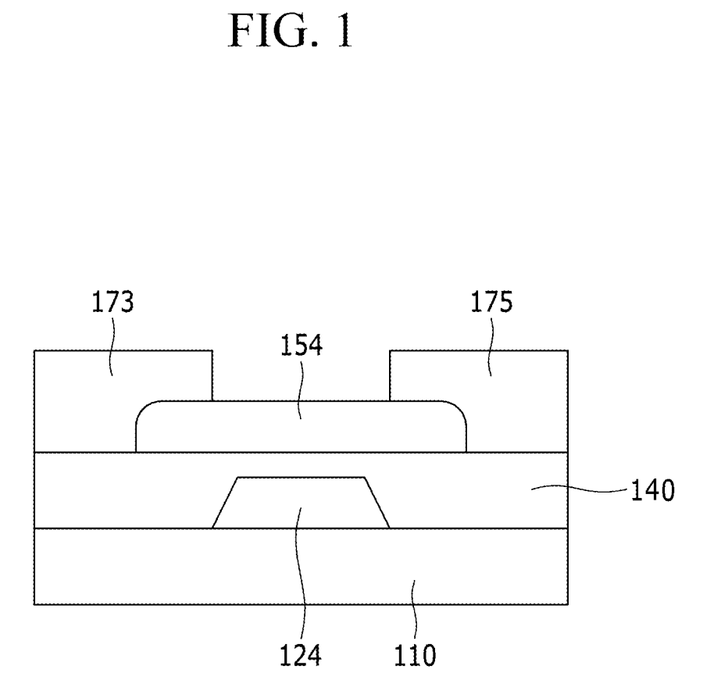
FIG. 1 is a cross-sectional view showing a thin film transistor according to example embodiments.

FIG. 1 is a cross-sectional view showing a thin film transistor according to example embodiments.

Referring to FIG. 1, a thin film transistor according to example embodiments includes a gate electrode 124 formed on a substrate 110, a semiconductor 154 overlapping with the gate electrode 124, a gate insulator 140 between the gate electrode 124 and the semiconductor 154, and a source electrode 173 and a drain electrode 175 that are electrically connected with the semiconductor 154.

The substrate 110 may be made of, for example, transparent glass, silicon, or a polymer. The gate electrode 124 is connected to a gate line (not shown) transmitting a data signal, and may be made of, for example, gold (Au), copper (Cu), nickel (Ni), aluminum (Al), molybdenum (Mo), chromium (Cr), tantalum (Ta), titanium (Ti), an alloy thereof, and a combination thereof, but is not limited thereto.

The semiconductor 154 may be an organic semiconductor or an inorganic semiconductor, for example an organic semiconductor. The organic semiconductor may be, for example, at least one selected from pentacene and a precursor thereof, tetrabenzoporphyrin and a derivative thereof, polyphenylene vinylene and a derivative thereof, polyfullerene and a derivative thereof, polythienylene vinylene and a derivative thereof, polythiophene and a derivative thereof, polythienothiophene and a derivative thereof, polyarylamine and a derivative thereof, phthalocyanine and a derivative thereof, metallized phthalocyanine or a halogenated derivative thereof, perylene tetracarboxylic dianhydride (PTCDA), naphthalene tetracarboxylic dianhydride (NTCDA), or an imide derivative thereof, perylene, or coronene, and substituent-containing derivatives thereof, but is not limited thereto.

The gate insulator 140 may be formed of the insulating ink, and may be, for example, formed by coating the insulating ink and photocuring and/or thermally curing the resultant to form a thin film. The photocuring may be performed using, for example, ultraviolet light (UV), and the thermally curing may be performed, for example, at about 130° C. to about 230° C. for about 20 minutes to about 180 minutes.

The source electrode 173 and the drain electrode 175 face each other with the semiconductor 154 therebetween, and are electrically connected with the semiconductor 154. The source electrode 173 is electrically connected to the data line (not shown) transferring the data signal. The source electrode 173 and the drain electrode 175 may be made of gold (Au), copper (Cu), nickel (Ni), aluminum (Al), molybdenum (Mo), chromium (Cr), tantalum (Ta), titanium (Ti), an alloy thereof, or a combination thereof, but are not limited thereto.

The thin film transistor may be applicable to various electronic devices (e.g., a semiconductor device, a flat panel display, an energy device, and a sensor). The electronic device may include, for example, a liquid crystal display (LCD), an organic light emitting diode (OLED) device, a solar cell, and an organic sensor.

Hereinafter, the present disclosure is illustrated in more detail with reference to examples. However, these are examples, and the present disclosure is not limited thereto.

SYNTHESIS EXAMPLE

Synthesis Example 1: Preparation of Surface-Treated Silica Nanoparticle 500 g of the aqueous alkali silica sol is passed through a column filled with strong acidic cation exchange resin to provide an acidic silica sol with pH of 2. 500 g of the acidic silica sol is introduced into a glass material reactor which is mounted with a reflux cooler and is capable of being agitated, and added with 1000 g of methanol and diluted. Subsequently, 12 g of 3-methacryloxypropyltrimethoxysilane is added and agitated at room temperature for one hour, and then is reacted for 6 hours while heating at 95° C. to perform the silica surface treatment. Subsequently, the surface-treated silica sol is vacuum distillated under the conditions of 50 cmHg at 80° C., so a part of water included in the silica sol is removed while concentrating the same to 500 g. Subsequently, 1000 g of methanol is added thereto and diluted, and the vacuum distillation is further performed 4 times to make the water content be less than 1 wt % and to provide a surface-treated silica nanoparticle represented by the following Chemical Formula 1a.

[Chemical Formula 1a]

In Chemical Formula 1a, ● denotes silica, and a wrinkle line denotes omission.

Synthesis Example 2: Preparation of Surface-Treated Zirconia Nanoparticle

A surface-treated zirconia nanoparticle is synthesized and prepared in accordance with the same procedure as in Synthesis Example 1, except that zirconia is used instead of silica.

Synthesis Example 3: Preparation of Surface-Treated Alumina Nanoparticle

A surface-treated alumina nanoparticle is synthesized and prepared in accordance with the same procedure as in Synthesis Example 1, except that alumina is used instead of silica.

Synthesis Example 4: Preparation of Surface-Treated Titania Nanoparticle A surface-treated titania nanoparticle is synthesized and prepared in accordance with the same procedure as in Synthesis Example 1, except that titania is used instead of silica.

Synthesis Example 5: Preparation of Polyorganosiloxane 43 g of methyltrimethoxysilane, 89 g of glycidoxypropyltrimethoxysilane, 183 g of 3-(methacryloxypropyl) trimethoxysilane, 86 g of diethoxydiphenylsilane, and 66 g of tetraethoxysilane are added and agitated at room temperature for one hour. Subsequently, 56 g of a hydrochloric acid aqueous solution having a concentration of 0.1 N is dripped for 2 hours thereto and additionally agitated at room temperature for 2 hours to perform a hydrolysis reaction. Subsequently, it is heated to 80° C. and reacted for 36 hours to perform condensation and polymerization, so as to provide a polyorganosiloxane represented by the following Chemical Formula 6a. The polyorganosiloxane has a weight average molecular weight of 2200.

[Chemical Formula 6a]

Preparation of Insulating Ink

Preparation Example 1

2 g of the surface-treated silica nanoparticle obtained from Synthesis Example 1, 10 g of polyorganosiloxane obtained from Synthesis Example 5, 5 g of pentaerythritol triacrylate, 1 g of aluminum acetoacetate, and 50 g of trimethylpropane triglycidyl ether are added together and mixed in a ball mill for one hour to prepare an insulating ink.

Preparation Example 2

An insulating ink is prepared in accordance with the same procedure as in Preparation Example 1, except that the surface-treated zirconia nanoparticle obtained from Synthesis Example 2 is used instead of the surface-treated silica nanoparticle obtained from Synthesis Example 1.

Preparation Example 3

An insulating ink is prepared in accordance with the same procedure as in Preparation Example 1, except that the surface-treated alumina nanoparticle obtained from Synthesis Example 3 is used instead of the surface-treated silica nanoparticle obtained from Synthesis Example 1.

Preparation Example 4

An insulating ink is prepared in accordance with the same procedure as in Preparation Example 1, except that the surface-treated titania nanoparticle obtained from Synthesis Example 4 is used instead of the surface-treated silica nanoparticle obtained from Synthesis Example 1.

Comparative Preparation Example 1

20 g of methacryloxypropyl trimethoxysilane is introduced into a flask and added with a solution in which a predetermined or given amount of hydrochloric acid is diluted in deionized water (0.001021 mol of hydrochloric acid per 1 cc of water) and reacted at room temperature for 30 minutes. Subsequently, 100 ml of tetrahydrofuran and 100 ml of diethylether are added to complete the reaction. The solution is then transferred into a separatory funnel and cleaned with 30 ml of water three times, and the volatile material is removed under reduced pressure to provide a colorless polyorganosiloxane. Subsequently, the polyorganosiloxane and the nanoparticle of tetra butoxy titanate (Ti(OC$_4$H$_9$)$_4$) are mixed at a weight ratio of 70:30, and the mixture is dissolved in butanol to provide an insulating ink in which nanoparticle is dispersed in polyorganosiloxane.

Comparative Preparation Example 2

43 g of methyltrimethoxysilane, 89 g of glycidoxypropyltrimethoxysilane, 183 g of 3-(methacryloxypropyl)trimethoxysilane, 86 g of diethoxydiphenylsilane, and 66 g of tetraethoxysilane are added in a flask and agitated at room temperature. Subsequently, 56 g of hydrochloric acid aqueous solution having a concentration of 0.1 N is dripped therein for 2 hours and agitated at room temperature for 2 hours to undergo a hydrolysis reaction. It is then reacted for 36 hours to perform condensation and polymerization after heating to 80° C. to provide a polyorganosiloxane compound. Subsequently, 5.01 g of the polyorganosiloxane synthesis product (35 wt %) dispersed in propylene glycol monomethylether acetic acid, 5.99 g of pentaerythritol triacrylate, and 0.23 g of trimethylpropane triglycidyl ether are added and mixed with a ball mill for one hour to provide an insulating ink.

Manufacture of Thin Film Transistor

Example 1

Molybdenum is formed on a glass substrate by a sputtering method, and is subjected to photolithography to provide a gate electrode. Subsequently, the insulating ink obtained from Preparation Example 1 is coated by a spin coating method, and then pre-annealed at 90° C. for 2 minutes and irradiated using a 200 W high-pressure mercury lamp having a wavelength region of 240 nm to 400 nm for one minute.

A pentacene derivative is then vacuum deposited to provide an organic semiconductor. Subsequently, gold (Au) is formed thereon by a sputtering method, and then a source electrode and a drain electrode are formed by performing photolithography to provide a thin film transistor.

Example 2

A thin film transistor is manufactured in accordance with the same procedure as in Example 1, except that the insulating ink obtained from Preparation Example 2 is used instead of the insulating ink obtained from Preparation Example 1.

Example 3

A thin film transistor is manufactured in accordance with the same procedure as in Example 1, except that the insulating ink obtained from Preparation Example 3 is used instead of the insulating ink obtained from Preparation Example 1.

Example 4

A thin film transistor is manufactured in accordance with the same procedure as in Example 1, except that the insulating ink obtained from Preparation Example 4 is used instead of the insulating ink obtained from Preparation Example 1.

Comparative Example 1

A thin film transistor is manufactured in accordance with the same procedure as in Example 1, except that the insulating ink obtained from Comparative Preparation Example 1 is used instead of the insulating ink obtained from Preparation Example 1.

Comparative Example 2

A thin film transistor is manufactured in accordance with the same procedure as in Example 1, except that the insulating ink obtained from Comparative Preparation Example 2 is used instead of the insulating ink obtained from Preparation Example 1.

Comparative Example 3

A thin film transistor is manufactured in accordance with the same procedure as in Example 1, except that a silicon oxide film is formed according to a chemical vapor deposition (CVD) method instead of coating the insulating ink obtained from Preparation Example 1 and curing the same.

Evaluation 1

The thin film transistors according to Examples 1 to 4 and Comparative Examples 1 to 3 are evaluated for a dielectric constant.

Table 1 shows dielectric constants of thin film transistors according to Examples 1 to 4 and Comparative Examples 1 to 3.

TABLE 1

| | Example 1 | Example 2 | Example 3 | Example 4 | Comparative Example 1 | Comparative Example 2 | Comparative Example 3 |
|---|---|---|---|---|---|---|---|
| Dielectric constant (@1 kHz) | 4.26 | 5.13 | 5.21 | 5.21 | 3.8 | 3.9 | 3.5 |

Referring to Table 1, it is confirmed that the thin film transistors according to Examples 1 to 4 have high dielectric constants compared to the thin film transistors according to Comparative Examples 1 to 3.

Evaluation 2

The thin film transistors according to Examples 1 to 4 and Comparative Examples 1 and 2 are evaluated for insulation strength.

Figure 2:
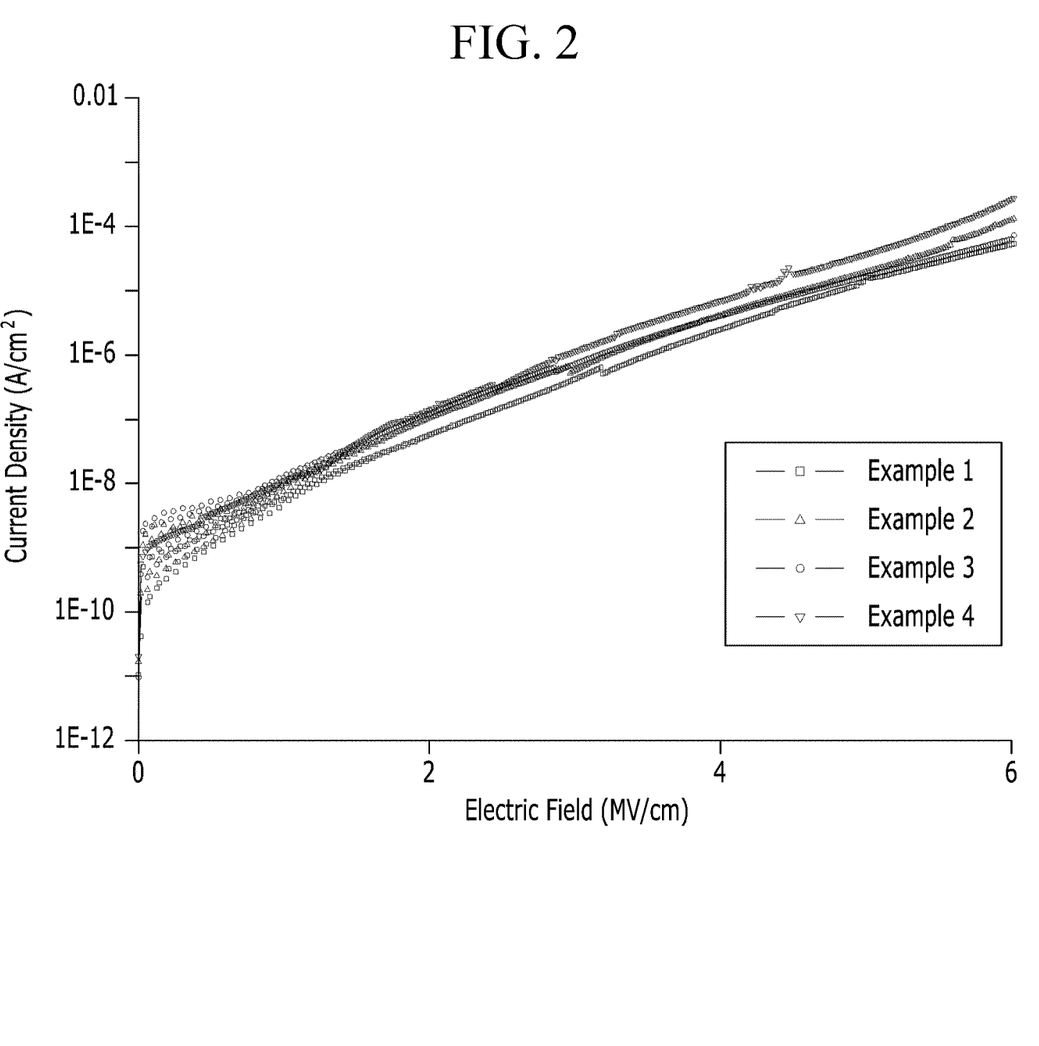
FIG. 2 is a graph showing insulation strength of thin film transistors according to Examples 1 to 4.
Figure 3:
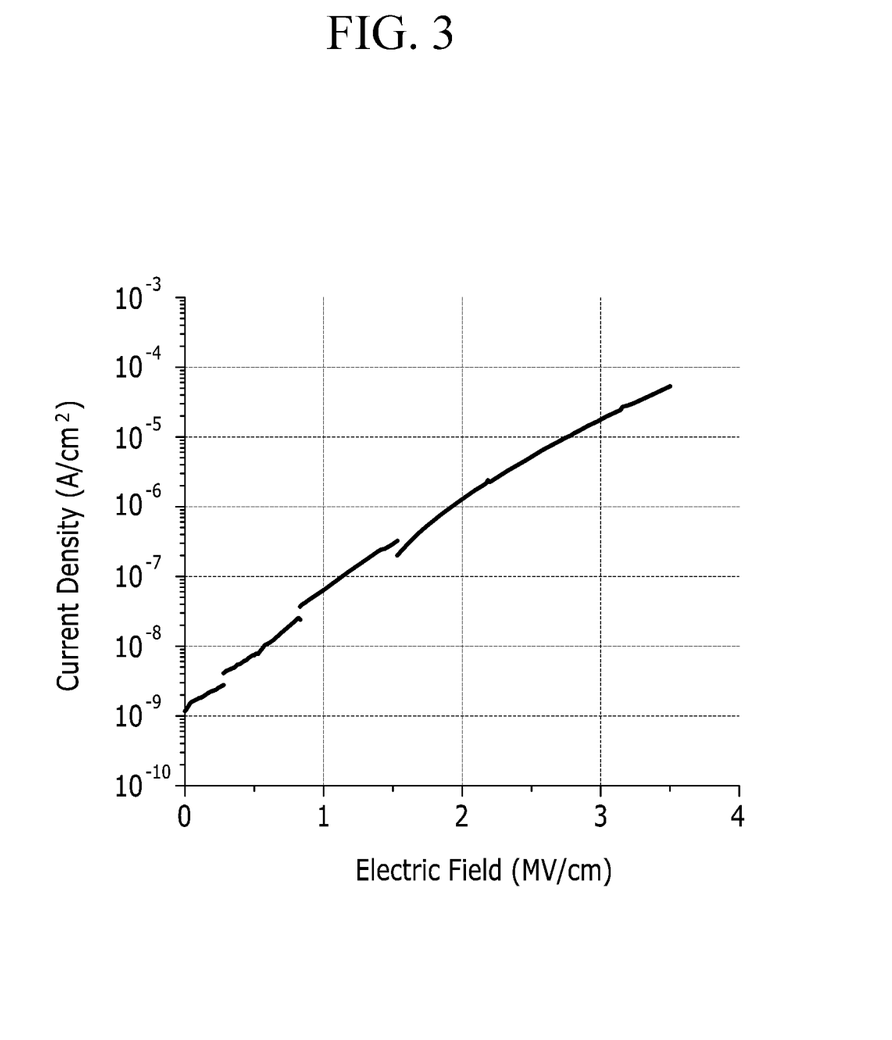
FIG. 3 is a graph showing insulation strength of thin film transistor according to Comparative Example 1.
Figure 4:
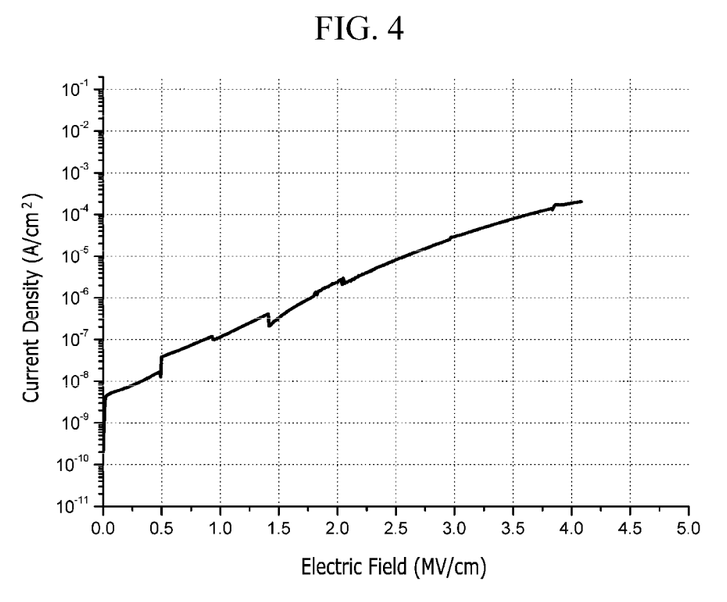
FIG. 4 is a graph showing insulation strength of thin film transistor according to Comparative Example 2.

FIG. 2 is a graph showing insulation strength of the thin film transistors according to Examples 1 to 4, FIG. 3 is a graph showing insulation strength of the thin film transistor according to Comparative Example 1, and FIG. 4 is a graph showing insulation strength of the thin film transistor according to Comparative Example 2.

Referring to FIG. 2 to FIG. 4, the thin film transistors according to Examples 1 to 4 have improved insulation strength compared to the thin film transistors according to Comparative Examples 1 and 2.

Evaluation 3

The thin film transistors according to Examples 1 to 4 and Comparative Examples 1 and 2 are evaluated for charge mobility and current characteristics.

The results are shown in Table 2.

TABLE 2

| | Charge mobility (cm$^2$/V · s) | Off current ($I_{off}$) | On-off current ratio ($I_{on}/I_{off}$) |
|---|---|---|---|
| Example 1 | 2.45 | 2.3 × 10$^{-11}$ | 6.7 × 10$^6$ |
| Example 2 | 2.15 | 3.8 × 10$^{-11}$ | 6.1 × 10$^6$ |
| Example 3 | 3.44 | 1.5 × 10$^{-11}$ | 1.3 × 10$^7$ |
| Example 4 | 2.22 | 2.8 × 10$^{-11}$ | 7.6 × 10$^6$ |
| Comparative Example 1 | 0.8 | 2.3 × 10$^{-10}$ | 8.8 × 10$^4$ |
| Comparative Example 2 | 0.9 | 5.6 × 10$^{-10}$ | 1.5 × 10$^5$ |

Referring to Table 2, the thin film transistors according to Example 1 to 4 have relatively high charge mobility and a relatively low leakage current compared to the thin film transistors according to Comparative Example 1 and 2, so as to provide improved current characteristics thereof.

While this disclosure has been described in connection with what is presently considered to be practical example embodiments, it is to be understood that the inventive concepts are not limited to the disclosed embodiments, but, on the contrary, is intended to cover various modifications and equivalent arrangements included within the spirit and scope of the appended claims.

What is claimed is:

1. An insulating ink, comprising:
   a nanoparticle bonded with a substituent having a polymerizable functional group;
   a polyorganosiloxane; and
   a solvent, wherein
   the polymerizable functional group is at least one of a photopolymerizable functional group and a thermally polymerizable functional group,
   the polymerizable functional group exists in an unpolymerized state in the insulating ink, and
   the polyorganosiloxane comprises a structure represented by Chemical Formula 6, $(R^1R^2R^3SiO_{1/2})_{M1}(R^4R^5SiO_{2/2})_{D1}(R^6SiO_{3/2})_{T1}$
   $(SiO_{4/2})_{Q1}$      [Chemical Formula 6]

wherein, in Chemical Formula 6,
   each of $R^1$ to $R^6$ are independently one of hydrogen, a substituted or unsubstituted $C_1$ to $C_{30}$ alkyl group, a substituted or unsubstituted $C_3$ to $C_{30}$ cycloalkyl group, a substituted or unsubstituted $C_6$ to $C_{30}$ aryl group, a substituted or unsubstituted C7 to $C_{30}$ arylalkyl group, a substituted or unsubstituted $C_1$ to $C_{30}$ heteroalkyl group, a substituted or unsubstituted $C_2$ to $C_{30}$ heterocycloalkyl group, a substituted or unsubstituted $C_2$ to $C_{30}$ alkenyl group, a substituted or unsubstituted $C_2$ to $C_{30}$ alkynyl group, a substituted or unsubstituted $C_1$ to $C_{30}$ alkoxy group, a substituted or unsubstituted $C_1$ to $C_{30}$ epoxy group, a substituted or unsubstituted $C_1$ to $C_{30}$ carbonyl group, a hydroxy group, and a combination thereof,
   0≤M1<1, 0≤D1<1, 0≤T1<1, 0≤Q1<1, and
   M+D+T+Q=1.

2. The insulating ink of claim 1, wherein the nanoparticle is represented by Chemical Formula 1:

M(-L-A)$_n$      [Chemical Formula 1]

wherein, in Chemical Formula 1,
   M is the nanoparticle,
   L is one of a single bond, a substituted or unsubstituted $C_1$ to $C_{20}$ alkylene group, a substituted or unsubstituted $C_6$ to $C_{30}$ arylene group, a substituted or unsubstituted $C_3$ to $C_{30}$ bivalent heterocyclic group, a substituted or unsubstituted $C_1$ to $C_{20}$ bivalent silyl group, a substituted or unsubstituted bivalent siloxane group, and a combination thereof,
   A is the polymerizable functional group, and
   n is an integer of 1 or more.

3. The insulating ink of claim 1, wherein at least one of $R^1$ to $R^6$ of Chemical Formula 6 includes one of a substituted or unsubstituted $C_2$ to $C_{30}$ alkenyl group, a substituted or unsubstituted $C_1$ to $C_{30}$ epoxy group, and a combination thereof.

4. The insulating ink of claim 1, wherein at least one of $R^4$ to $R^6$ of Chemical Formula 6 includes one of a substituted or unsubstituted $C_2$ to $C_{30}$ alkenyl group, a substituted or unsubstituted $C_1$ to $C_{30}$ epoxy group, and a combination thereof.

5. The insulating ink of claim 1, wherein the nanoparticle includes a metal oxide.

6. The insulating ink of claim 1, wherein the nanoparticle includes one of silica, titania, barium titanate, zirconia, barium sulfate, alumina, hafnium oxide, and a combination thereof.

7. The insulating ink of claim 1, wherein the nanoparticle is present in an amount of about 2 to about 70 parts by weight based on 100 parts by weight of the polyorganosiloxane.

8. The insulating ink of claim 1, further comprising:
   at least one of a cross-linking agent and a cross-linking auxiliary agent.

9. The insulating ink of claim 8, wherein
   the cross-linking agent is one of a (meth)acrylate compound and an ether compound, and
   the cross-linking auxiliary agent is an organometal compound.

10. The insulating ink of claim 1, further comprising:
    at least one of a photoinitiator, a photoacid generator, and a dispersing agent.

11. An insulator including a cured product of the insulating ink of claim 1.

12. A thin film transistor comprising:
    a gate electrode;
    a semiconductor overlapping the gate electrode;
    an insulator including a cured product of the insulating ink of claim 1, the insulator being between the gate electrode and the semiconductor; and
    a source electrode and a drain electrode electrically connected with the semiconductor.

13. The thin film transistor of claim 12, wherein the semiconductor is an organic semiconductor.

14. An electronic device comprising the thin film transistor of claim 12.

* * * * *